(12) United States Patent
Forbes et al.

(10) Patent No.: US 6,812,137 B2
(45) Date of Patent: Nov. 2, 2004

(54) METHOD OF FORMING COAXIAL INTEGRATED CIRCUITRY INTERCONNECT LINES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/197,554

(22) Filed: Jul. 18, 2002

(65) Prior Publication Data

US 2002/0175423 A1 Nov. 28, 2002

Related U.S. Application Data

(62) Division of application No. 09/778,913, filed on Feb. 8, 2001.

(51) Int. Cl.[7] .......................................... H01L 21/4763
(52) U.S. Cl. ........................ 438/629; 438/667; 438/668; 438/687
(58) Field of Search ................................. 438/108, 667, 438/668, 629, 637, 639, 687; 257/700, 758, 774

(56) References Cited

U.S. PATENT DOCUMENTS

| | | | |
|---|---|---|---|
| 5,233,133 A | * | 8/1993 | Iwasaki et al. ............. 174/250 |
| 5,286,926 A | * | 2/1994 | Kimura et al. .............. 174/250 |
| 5,378,926 A | | 1/1995 | Chi et al. |
| 5,510,655 A | | 4/1996 | Tanielian |
| 5,783,866 A | | 7/1998 | Lee et al. |
| 6,107,109 A | | 8/2000 | Akram et al. |
| 6,114,240 A | | 9/2000 | Akram et al. |
| 6,122,187 A | | 9/2000 | Ahn et al. |
| 6,130,161 A | | 10/2000 | Ashley et al. |
| 6,143,616 A | * | 11/2000 | Geusic et al. ............... 438/389 |
| 6,198,168 B1 | | 3/2001 | Geusic et al. |
| 6,271,592 B1 | | 8/2001 | Kim et al. |
| 6,344,413 B1 | | 2/2002 | Zurcher et al. |
| 6,368,954 B1 | | 4/2002 | Lopatin et al. |
| 6,376,908 B1 | | 4/2002 | Gaku et al. |
| 6,383,835 B1 | | 5/2002 | Hata et al. |
| 6,404,061 B1 | | 6/2002 | Hikita et al. |
| 6,452,117 B2 | | 9/2002 | Curcio et al. |
| 6,565,730 B2 | | 5/2003 | Chakravorty et al. |
| 2001/0005056 A1 | | 6/2001 | Cohen |
| 2002/0105087 A1 | * | 8/2002 | Forbes et al. ............... 257/774 |

FOREIGN PATENT DOCUMENTS

| | | |
|---|---|---|
| JP | 58-201347 | 11/1983 |
| JP | 61-161746 | 7/1986 |
| JP | 62-39032 | 2/1987 |
| JP | 62-241361 | 10/1987 |
| JP | 2-28358 | 1/1990 |
| JP | 3-171760 | 7/1991 |

\* cited by examiner

*Primary Examiner*—Hsien Ming Lee
(74) *Attorney, Agent, or Firm*—Dickstein Shapiro Morin & Oshinsky LLP

(57) ABSTRACT

The present invention provides a semiconductive substrate which includes front and back surfaces and a hole which extends through the substrate and between the front and back surfaces. The hole is defined in part by an interior wall portion and forms an outer conductive sheath. Conductive material is formed proximate at least some of the interior wall portion. Subsequently, a layer of dielectric material is formed within the hole, over and radially inwardly of the conductive material. A second conductive material is then formed within the hole over and radially inwardly of the dielectric material layer. The latter conductive material constitutes an inner conductive coaxial line component.

16 Claims, 6 Drawing Sheets

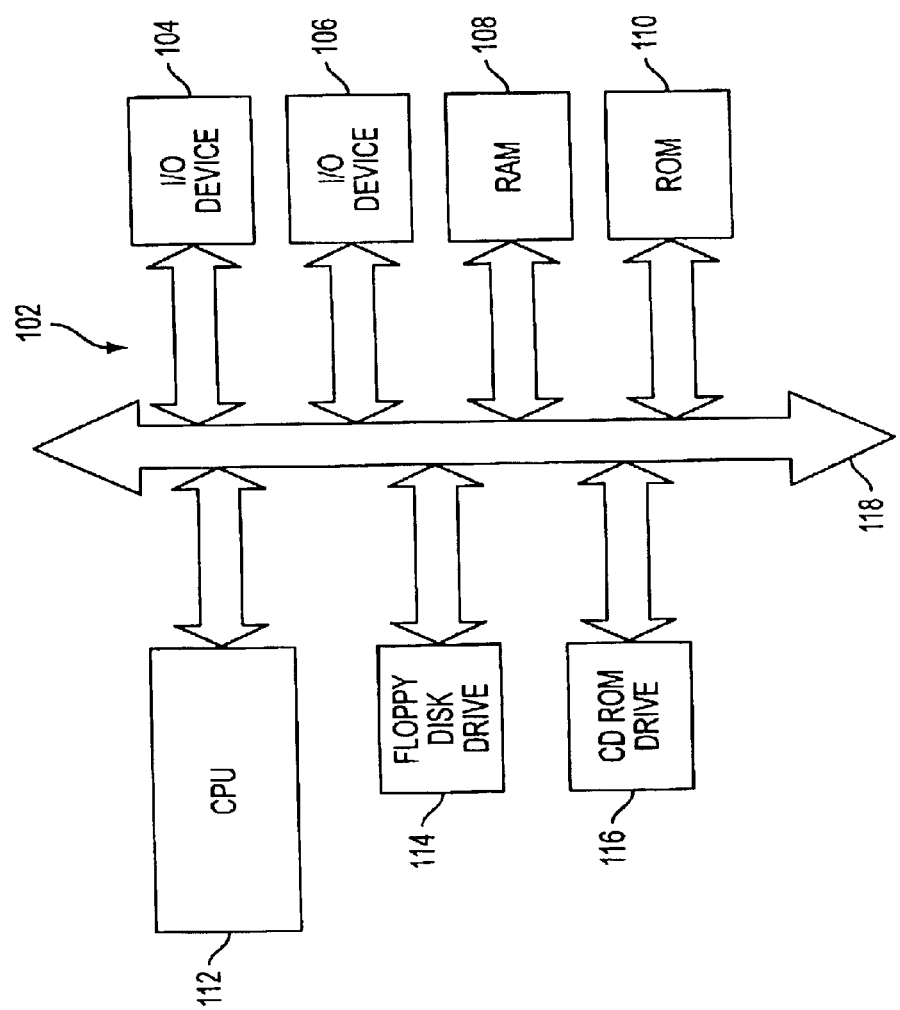

US 6,812,137 B2

METHOD OF FORMING COAXIAL INTEGRATED CIRCUITRY INTERCONNECT LINES

This a plication is a divisional application of U.S. patent application Ser. No. 09/778,913, filed on Feb. 8, 2001, the entirety of which is incorporated herein by reference.

FIELD OF THE INVENTION

This invention relates to integrated circuitry interconnect lines, in particular, to through-wafer, integrated circuitry interconnect lines.

DISCUSSION OF THE RELATED ART

Semiconductor devices are typically fabricated on a wafer which is subsequently tested and separated into individual dies or chips. Individual dies are then packaged. Packaged chips are then assembled together, typically on a printed circuit board (PCB), and electrically interconnected to perform a desired function. The electrical interconnection of separately fabricated chips generally takes place externally of the individual chips. While PCB techniques are useful for bringing together separately fabricated and assembled chips, doing so brings with it some problems which are not so easily overcome. For example, PCBs consume a large amount of physical space compared to the circuitry of the chips which are mounted to them. It is desirable to reduce the amount of physical space required by such PCBs. Further, assuring the electrical integrity of interconnections between chips mounted on PCBs is a challenge. Moreover, in certain applications, it is desirable to reduce the physical length of electrical interconnections between devices because of concerns with signal loss or dissipation and interference with and by other integrated circuitry devices.

A continuing challenge in the semiconductor industry is to find new, innovative, and efficient ways of forming electrical connections with and between circuit devices which are fabricated on the same and on different dies. Relatedly, continuing challenges are posed to find and/or improve upon the packaging techniques utilized to package integrated circuitry devices, particularly as device dimensions continue to shrink.

SUMMARY OF THE INVENTION

The present invention provides coaxial interconnect lines which are more reliable and better accommodate reduced circuitry dimensions and a method of forming such coaxial interconnect lines.

A semiconductive substrate is provided which includes front and back surfaces, and a hole which extends through the substrate and between the front and back surfaces. The hole is defined in part by an interior wall portion. Conductive material is formed proximate at least some of the interior wall portion. This conductive material provides an outer coaxial line component. Subsequently, a layer of dielectric material is formed within the hole, over and radially inwardly of the conductive material. A second conductive material is then formed within the hole over and radially inwardly of the dielectric material layer. The latter conductive material constitutes an inner conductive coaxial line component.

In a preferred implementation, the inner conductive coaxial line component is formed by forming a first conductive material within the hole. A second material is formed over the first material, with at least the second material being a seed layer. Subsequently, a metal-containing layer is electroplated onto the seed layer.

The substrate may be used as a chip carrier, or the substrate may have circuit components fabricated thereon and itself be formed an integrated circuit chip.

BRIEF DESCRIPTION OF THE DRAWINGS

The above advantages and features of the invention will be more clearly understood from the following detailed description which is provided in connection with the accompanying drawings.

FIG. 11 is a processor based system employing the through-hole, coaxial interconnections in accordance with an exemplary embodiment of the present invention.

DETAILED DESCRIPTION OF THE INVENTION

Figure 1:
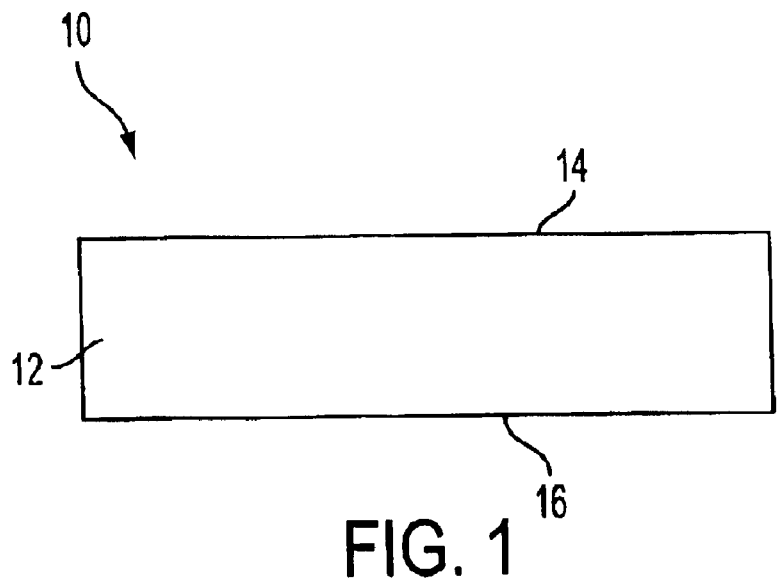
FIG. 1 is a cross-sectional view of a semiconductor wafer fragment at one processing step in accordance with the invention.

Exemplary embodiment of the present invention will be described below in connection with the drawings. Other embodiments may be utilized and structural or logical changes may be made without departing from the spirit or scope of the present invention. Although exemplary process conditions for forming various material layers are described below, these are only representative and are not meant to be considered as limiting the invention. Like items are referred to by like reference numerals throughout the drawings.

The term "substrate" used in the following description may include any semiconductor-based structure that has an exposed semiconductor surface. Semiconductor-based structure must be understood to include silicon, silicon-on insulator (SOI), silicon-on sapphire (SOS), doped and undoped semiconductors, epitaxial layers of silicon supported by a base semiconductor structure foundation, and other semiconductor structures. The semiconductor-based structures need not be silicon-based. The semiconductor could be silicon-germanium, germanium, or gallium arsenide. When reference is made to substrate in the following description, previous process steps may have been utilized to form regions or junctions in or over the base semiconductor or foundation.

Referring to FIG. 1, a semiconductor wafer fragment is indicated generally at 10 and includes a semiconductor substrate 12. Substrate 12 includes a first or front surface 14 and a second or back surface 16. In one aspect, substrate 12 is a semi-conductor structure having first and second outwardly-facing surfaces 14, 16, at least one of which is capable of supporting fabricated integrated circuitry. Substrate 12 may be formed of a monocrystalline silicon wafer.

Figure 2:
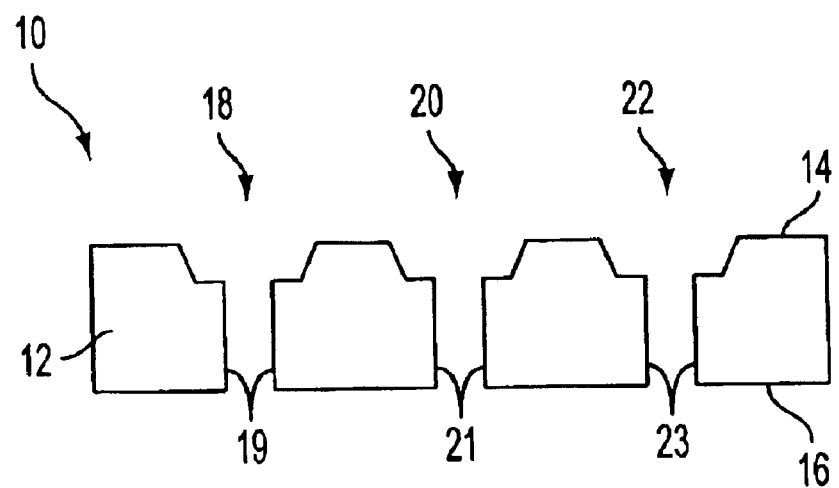
FIG. 2 is a cross-sectional view of the semiconductor wafer fragment at a processing step subsequent to that shown by FIG. 1.

Referring to FIG. 2, a plurality of holes or passageways 18, 20, and 22 are formed within substrate 12 between front and back surfaces 14, 16. Each hole or passageway is defined, at least in part, by a respective interior wall portion 19, 21, and 23. The illustrated interior wall portions constitute interior hole surfaces which join with first and second surfaces 14, 16. Holes 18, 20, and 22 can be formed through any suitable processing techniques, with one being described below with reference to FIGS. 3 and 4.

Figure 3:
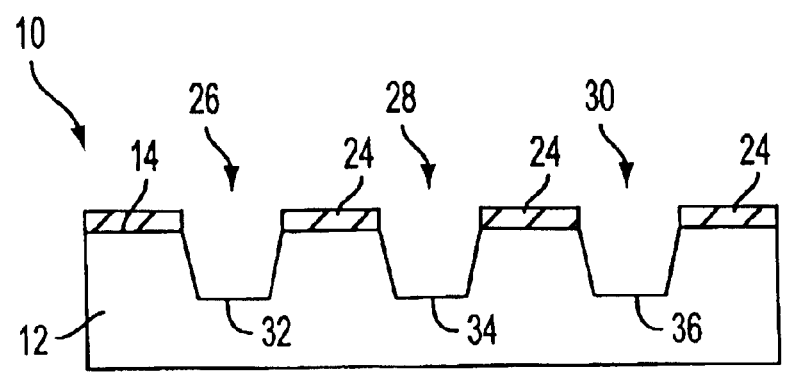
FIG. 3 is a cross-sectional view of the semiconductor wafer fragment at a processing step subsequent to that shown by FIG. 1.

Referring to FIG. 3, substrate 12 is shown at a processing step which is applied to the FIG. 1 construction and which precedes the FIG. 2 construction. A layer 24 of masking material, such as photoresist, is formed over front surface 14 and is suitably patterned to define a plurality of openings 26, 28, and 30. Openings 26, 28, and 30 are formed over a substrate area in which holes 18, 20, and 22 (FIG. 2) are to be formed. An alkaline etch can be conducted which is effective to form a to pattern of pre-defined etch pits 32, 34, and 36. Subsequently, masking material layer 24 is stripped away.

Figure 4:
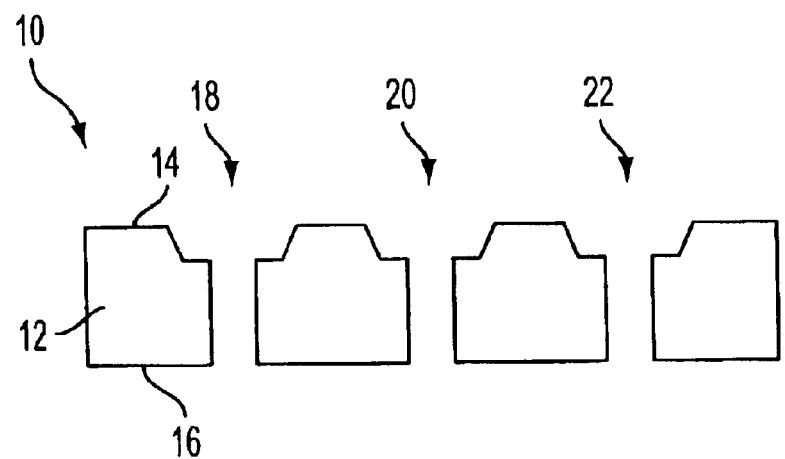
FIG. 4 is a cross-sectional view of the semiconductor wafer fragment at a processing step subsequent to that shown by FIG. 3.

Referring to FIG. 4, a through wafer silicon trench etch is next performed to form holes 18, 20 and 22, using a high density low pressure (HDLP) reactive ion etching (RIE) at a rate of about 2.2 $\mu$m/min. using $SF_6/C_4F_8$. A photoresist can be used as a mask for this etching. Continuous etching/passivation cycles are used to achieve anisotropic, high aspect ratio trenches. In one embodiment, exemplary aspect ratios can be greater than about 100. More preferably, aspect ratios can be greater than about 200.

Figure 5:
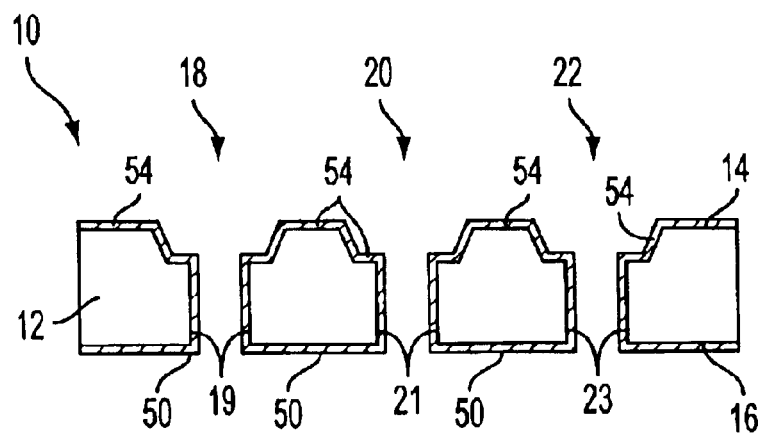
FIG. 5 is a cross-sectional view of the semiconductor wafer fragment at a processing step subsequent to that shown by FIG. 4.

Referring to FIG. 5, outer conductive sheaths 50 are formed within holes or passageways 18, 20, and 22 and over respective interior wall portions 19, 21, and 23. Sheaths 50 are preferably formed by depositing a layer 54 of metal-containing material over the substrate, within the holes and over the respective wall portions 19, 21, and 23 thereof. Any suitable method of providing such metal-containing layer can be utilized. An exemplary method includes a low-pressure chemical vapor deposition (LPCVD) of tungsten in a self-limiting process which provides a tungsten film by silicon reduction. Accordingly, silicon material within holes 18, 20, and 22 is replaced by tungsten atoms in a $WF_6$ reaction gas, with a reaction product $SiF_4$ being pumped out or otherwise removed from the deposition chamber. Subsequently, such can be followed by silane or polysilane reduction of the $WF_6$ until a desired conductor thickness is reached. In a preferred embodiment, the thickness of layer 54 is about 0.3 $\mu$m to about 0.5 $\mu$m. Deposition rates in accordance with the above are dependent upon the temperature and the reaction gas flow rate. Exemplary deposition rates are 1 micron per minute, at temperatures of about 300° C. and with a flow rate of $WF_6$ at 4 sccm in a cold wall CVD reactor.

Figure 6:
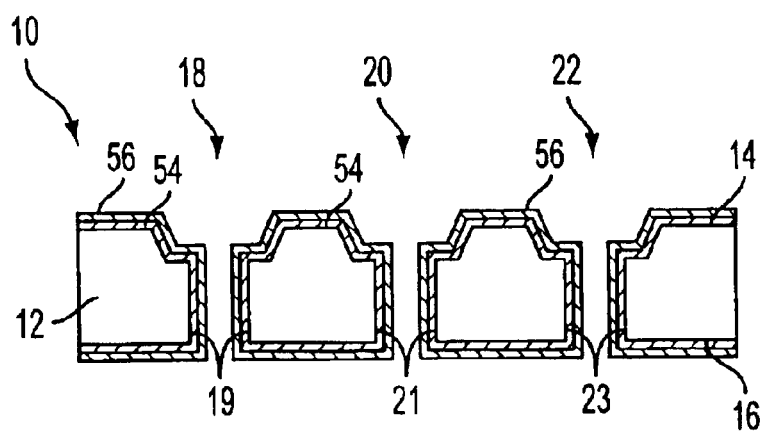
FIG. 6 is a cross-sectional view of the semiconductor wafer fragment at an alternate processing step subsequent to that shown by FIG. 5.

Referring to FIG. 6, a dielectric material 56 is formed over layer 54 and within holes 18, 20, and 22. The dielectric material 56 is preferably formed to a thickness of about 0.5 $\mu$m to about 0.8 $\mu$m. Portions of layer 56 are thereby formed radially inwardly of interior wall portions 19, 21, and 23 and outer conductive sheath 50. An exemplary dielectric material is $SiO_2$. Alternatively, dielectric layer 56 can comprise a nitride-containing layer, such as $Si_3N_4$, which is disposed proximate respective interior wall portions 19, 21, and 23. An oxide-containing layer is formed over the nitride-containing layer to provide a dielectric SiON layer within the hole. In a preferred implementation, the nitride layer is formed by chemical vapor deposition, and the oxide layer by exposing the substrate to oxidizing conditions. Specifically, in the preferred implementation, dielectric layers 56 constitute a reoxidized LPCVD nitride film which forms the illustrated and preferred SiON dielectric layer. An exemplary processing implementation includes in-situ nitridation in an ammonia atmosphere at 950° C. Low pressure chemical vapor deposition of nitride at 700° C. takes place with dichlorosilane and ammonia until about two-thirds of the hole diameter is filled. Subsequently, reoxidation of the nitride takes place at a temperature of between 900° C. to 950° C.

Figure 7:
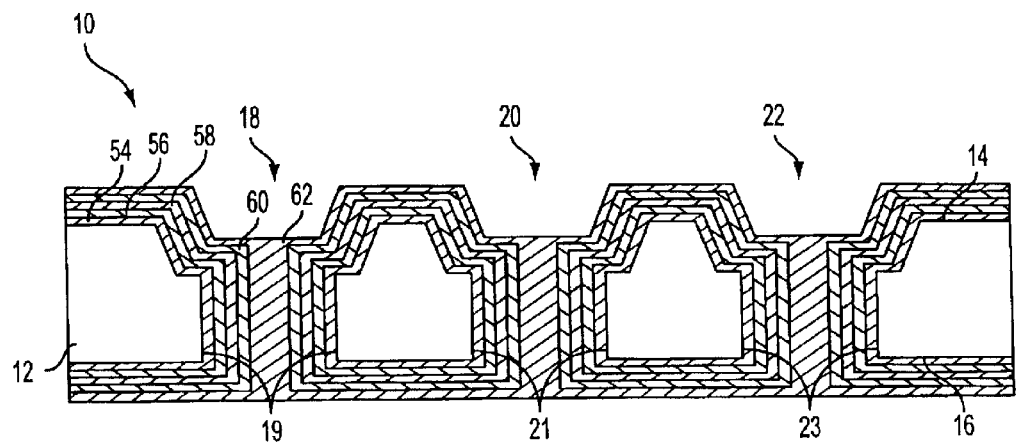
FIG. 7 is a cross-sectional view of the semiconductor wafer fragment at a processing step subsequent to that shown by FIG. 6.

Referring to FIG. 7, a first layer of conductive material 58 is formed over dielectric layer 56 and within each respective hole 18, 20, and 22. In a preferred aspect, such first conductive material constitutes polysilicon which is formed through suitable chemical vapor deposition techniques. Accordingly, such first conductive material is formed over and radially inwardly of dielectric material layer 56 within holes 18, 20, and 22. A second layer of conductive material 60 is formed over the substrate 12 and first material 58. In one aspect, second conductive material 60 comprises a metal material which is different from the first conductive material 58. In a preferred aspect, second conductive material 60 constitutes a copper seed layer which is formed over first conductive material 58. Such material or film can be deposited through suitable sputtering or evaporation techniques. Mechanical masks can be utilized to define with more particularity the area over which the preferred copper-seed layer is deposited. Second material 60 is preferably deposited over front and back surfaces 14, 16 to a thickness of about 20 to about 40 nm. Next, a metal layer, preferably a copper layer is electroplated onto seed-layer 60 to form layer 62 which completely fills in holes 18, 20 and 22. Preferably, layer 62 is formed to a thickness of about 2–3 $\mu$m.

Figure 8:
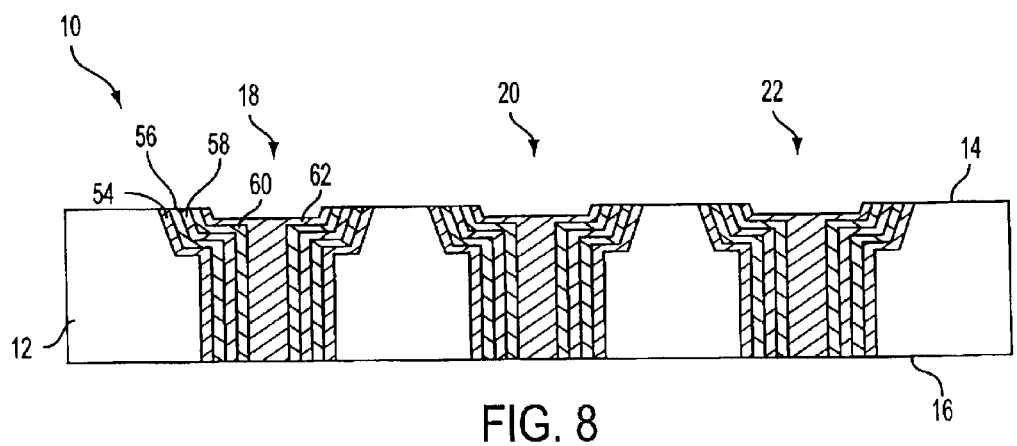
FIG. 8 is a cross-sectional view of the semiconductor wafer fragment at a processing step subsequent to that shown by FIG. 7.

Referring to FIG. 8, layers 54, 55, 58, 60 and 62 are planarized relative to substrate 12 and isolated within respective holes 18, 20, and 22. Such can be accomplished by any suitable processing techniques. Exemplary techniques include abrasion of the substrate as by chemical mechanical polishing.

Hence, a method of forming integrated circuitry lines such as coaxial integrated circuitry interconnect lines is described. A semiconductive substrate is provided which includes front and back surfaces, and a hole is formed which extends through the substrate and between the front and back surfaces. The hole is defined in part by an interior wall portion. Conductive material is formed proximate at least some of the interior wall portion to form an outer conductive layer. Subsequently, a layer of dielectric material is formed within the hole, over and radially inwardly of the conductive material. A second conductive material is then formed within the hole over and radially inwardly of the dielectric material layer. The latter conductive material constitutes an inner conductive coaxial line component. In a preferred implementation, the inner conductive coaxial line component is formed by forming a first conductive material within the hole. A second conductive material is formed over the first conductive material, with at least the second material being a seed layer. Subsequently, a metal-containing layer is electroplated onto the seed layer.

Figure 9:
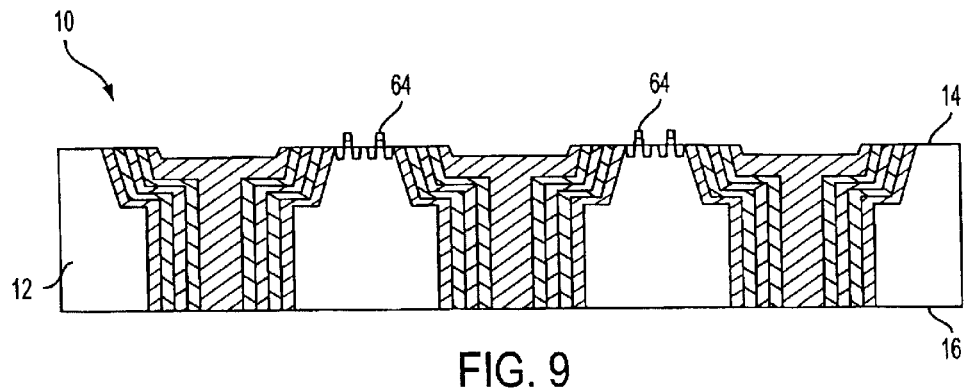
FIG. 9 is a cross-sectional view of the semiconductor wafer fragment of FIG. 8 including circuit devices fabricated on the wafer.
Figure 10:
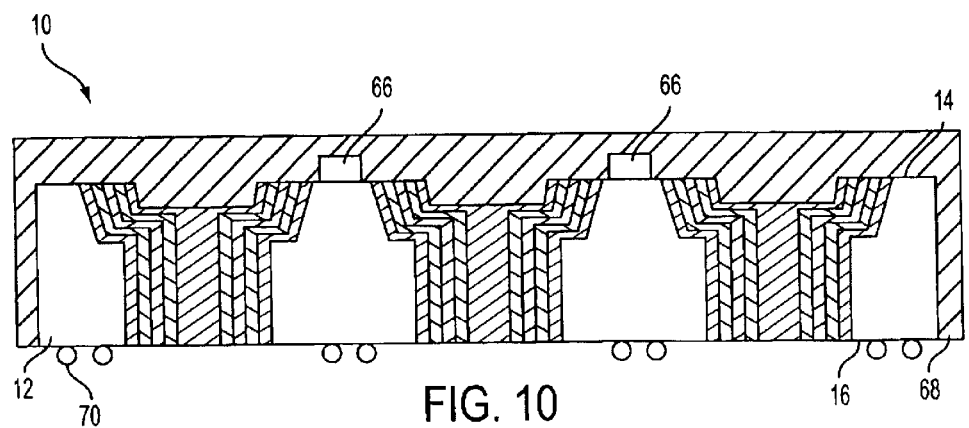
FIG. 10 is a cross-sectional view of the semiconductor wafer fragment of FIG. 8 including integrated circuit chips mounted on the wafer.

Referring to FIGS. 9 and 10, substrate 12 may also support fabricated circuit devices 64 and multi-layer wiring patterns and may be encapsulated by encapsulant 68 in a single integrated package. In such an implementation multiple exterior terminals 70 are provided for connecting interior packaged conductors to an external circuit. In addition, substrate 12 may be a carrier which is used to mount, support and interconnect other integrated circuit chips 66 mounted over one or both of the surfaces 14, 16.

FIG. 11 illustrates a processor system 102, including central processing unit (CPU) 112, RAM and ROM memory devices 108, 110, input/output (I/O) devices 104, 106, floppy disk drive 114 and CD ROM drive 116. All of the above components communicate with each other over one or more bus systems 118. One or more of the central processing unit (CPU) 112, RAM and ROM memory devices 108, 110 are fabricated on substrate 12 or as IC chips which are mounted on a substrate 12 carrier, as illustrated in FIGS. 9 and 10, with through-hole, coaxial interconnections in accordance with the invention. In addition, RAM 108 may be constructed as one or more memory modules each containing one or more memory circuits containing coaxial interconnections fabricated in accordance with the invention.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method of forming coaxial integrated circuitry interconnect lines comprising:
   providing a substrate having front and back surfaces;
   forming a hole with sidewalls extending through said substrate from said front to said back surface;
   forming an outer conductive coaxial sheath on said sidewalls;
   forming a coaxial dielectric layer radially inward and over said outer conductive coaxial sheath; and
   forming an inner coaxial line radially inward and over said coaxial dielectric layer, wherein forming an inner coaxial line further comprises forming an inner conductive layer, forming a seed layer over said inner conductive layer, and electroplating a metal on said seed layer.

2. The method of claim 1 wherein said outer conductive coaxial sheath is a tungsten sheath.

3. The method of claim 2 wherein said outer conductive coaxial sheath is formed by low pressure chemical vapor deposition.

4. The method of claim 3 wherein said deposition is performed at a rate of about 1 micron per minute.

5. The method of claim 3 wherein said outer conductive coaxial sheath is formed to a thickness of about 0.3 $\mu$m to about 0.5 $\mu$m.

6. The method of claim 1 wherein said coaxial dielectric layer comprises silicon dioxide.

7. The method of claim 1 wherein said coaxial dielectric layer is formed to a thickness of about 0.5 $\mu$m to about 0.8 $\mu$m.

8. The method of claim 1 wherein said coaxial dielectric layer comprises a nitride containing layer.

9. The method of claim 8 wherein said nitride containing layer is formed by low pressure chemical vapor deposition.

10. The method of claim 1 wherein said inner conductive layer is a polysilicon layer.

11. The method of claim 1 wherein said seed layer is formed to a thickness of about 20 nm–40 nm.

12. The method of claim 1 wherein said metal is copper.

13. The method of claim 1 wherein said electroplated metal is about 2–3 $\mu$m thick.

14. The method of claim 1 further comprising the act of fabricating circuit devices on said substrate.

15. The method of claim 1 further comprising the act of mounting integrated circuit chips on said substrate.

16. The method of claim 15 further comprising the act of encapsulating said integrated circuit chip and substrate.

* * * * *